United States Patent
Sridevan

(10) Patent No.: US 7,767,500 B2
(45) Date of Patent: Aug. 3, 2010

(54) SUPERJUNCTION DEVICE WITH IMPROVED RUGGEDNESS

(75) Inventor: Srikant Sridevan, Redondo Beach, CA (US)

(73) Assignee: Siliconix Technology C. V., Singapore (SG)

( * ) Notice: Subject to any disclaimer, the term of this patent is extended or adjusted under 35 U.S.C. 154(b) by 0 days.

(21) Appl. No.: 11/586,901

(22) Filed: Oct. 26, 2006

(65) Prior Publication Data

US 2007/0048909 A1   Mar. 1, 2007

Related U.S. Application Data

(62) Division of application No. 10/968,499, filed on Oct. 19, 2004, now Pat. No. 7,166,890.

(60) Provisional application No. 60/513,174, filed on Oct. 21, 2003.

(51) Int. Cl.
*H01R 4/24* (2006.01)
*H01L 23/62* (2006.01)

(52) U.S. Cl. .................. 438/132; 438/434; 257/339; 257/E29.06

(58) Field of Classification Search .......... 438/247, 438/390, 268, 132, 434; 257/339, 328, 653, 257/655, 329, E29.06
See application file for complete search history.

(56) References Cited

U.S. PATENT DOCUMENTS

| | | | |
|---|---|---|---|
| 6,040,600 | A | 3/2000 | Uenishi et al. |
| 6,353,252 | B1 | 3/2002 | Yasuhara et al. |
| 6,410,958 | B1 | 6/2002 | Usui et al. |
| 6,441,455 | B1 | 8/2002 | Dutta |
| 6,498,368 | B2 | 12/2002 | Sakamoto et al. |
| 6,509,240 | B2 | 1/2003 | Ren et al. |
| 6,605,862 | B2 | 8/2003 | Van Dalen et al. |
| 6,621,122 | B2 | 9/2003 | Qu |
| 6,674,126 | B2 | 1/2004 | Iwamoto et al. |
| 6,683,347 | B1 | 1/2004 | Fujihira |
| 6,700,141 | B2 | 3/2004 | Iwamoto et al. |
| 6,713,813 | B2 | 3/2004 | Marchant |
| 6,740,931 | B2 | 5/2004 | Kouzuki et al. |
| 6,762,455 | B2 | 7/2004 | Oppermann et al. |
| 6,764,906 | B2 | 7/2004 | Darwish |

(Continued)

FOREIGN PATENT DOCUMENTS

DE   198 40 032   11/1999

(Continued)

OTHER PUBLICATIONS

Translation of a portion of the Office Action for Japanese Patent Application No. 2004-306311.

(Continued)

*Primary Examiner*—Long Pham
*Assistant Examiner*—Steven H Rao

(57) ABSTRACT

An improved superjunction semiconductor device includes a charged balanced pylon in a body region, where a top of the pylon is large to create slight charge imbalance. A MOSgated structure is formed over the top of the pylon and designed to conduct current through the pylon. By increasing a dimension of the top of the pylon, the resulting device is less susceptible to variations in manufacturing tolerances to obtain a good breakdown voltage and improved device ruggedness.

14 Claims, 2 Drawing Sheets

U.S. PATENT DOCUMENTS

| | | |
|---|---|---|
| 6,768,170 B2 | 7/2004 | Zhou |
| 6,828,609 B2 | 12/2004 | Deboy et al. |
| 6,849,900 B2 | 2/2005 | Aida et al. |
| 6,979,862 B2 | 12/2005 | Henson |
| 7,166,890 B2 | 1/2007 | Sridevan |
| 7,492,003 B2 | 2/2009 | Kinzer |
| 2001/0052601 A1 | 12/2001 | Onishi et al. |
| 2002/0063281 A1 | 5/2002 | Tihanyl |
| 2004/0150040 A1 | 8/2004 | Nitta et al. |
| 2004/0245570 A1 | 12/2004 | Ninomiya |
| 2005/0082570 A1 | 4/2005 | Sridevan |
| 2007/0222025 A1 | 9/2007 | Husain et al. |

FOREIGN PATENT DOCUMENTS

| | | |
|---|---|---|
| JP | 11-348355 | 6/2000 |
| JP | 2001313391 | 11/2001 |
| JP | 2003-74951 | 6/2002 |

OTHER PUBLICATIONS

Translation of a portion of the Office Action for Japanese Patent Application No. 2004-306311; Issue Date Feb. 27, 2007.

US 7,767,500 B2

SUPERJUNCTION DEVICE WITH IMPROVED RUGGEDNESS

CROSS-REFERENCE TO RELATED APPLICATIONS

This application is a divisional of U.S. patent application Ser. No. 10/968,499, filed Oct. 19, 2004, entitled SUPERJUNCTION DEVICE WITH IMPROVED RUGGEDNESS which is based on and claims priority to U.S. Provisional Application Ser. No. 60/513,174, filed Oct. 21, 2003, entitled SUPERJUNCTION DEVICE WITH IMPROVED RUGGEDNESS, the entire contents of which are incorporated herein by reference.

FIELD OF THE INVENTION

This invention relates to superjunction devices and a process for their manufacture, and more specifically to the increase of the ruggedness of superjunction devices, and the increase of the process window tolerances for such devices.

BACKGROUND OF THE INVENTION

Superjunction devices possess the advantage of significantly reduced $R_{dson}$ for the same high breakdown voltage (BV) of a conventional MOSFET. The superjunction is comprised of a multi-layer, for example, a six-layer sequence of implant and epitaxy to form spaced P-columns which is used to balance the charge in the N type drift region epi which receives the columns. The same reticle is used repetitively on the six layers to generate the P-column.

The charge balance is critical with a small process window. Exceeding this window on the P-type side (that is, having an excessive P charge in the P columns) leads to the BV falling below the spec. Exceeding this window on the N-type side leads to high BV but can lead to ruggedness reduction.

Device ruggedness can be enhanced by structural modifications that force the current to flow through the P-column rather than outside it. Such structures are shown in copending application Ser. No. 60/417,212, filed Oct. 8, 2002 and assigned to the assignee of the present invention, and which is incorporated herein by reference. In that case, the top-most portion only of the P columns had a higher and unbalanced P concentration (charge) than the remainder of the columns, which have a balanced concentration against the surrounding N type body. This caused avalanche current at the top of the columns to be diverted from under the MOSFET source regions (the $R_b{'}$ region) and toward the axis of the column.

BRIEF DESCRIPTION OF THE INVENTION

The invention proposes a different modification. Instead of using the same design for all the layers, the topmost layer design is modified with a slightly larger feature (diameter) and thus increased volume and P charge, solely in the active area such that the BV of the active area cells is reduced selectively and also so that the current flows into or toward the axis of the P column, thus improving the ruggedness. The lower 5 layers and the termination can then be optimized for maximum BV. The use of the separate upper or $6^{th}$ layer design will allow the realization of high termination BV, relatively lower active area BV and current flow in the P-column. The conjunction of these 3 factors will improve the ruggedness and increase the process window tolerance since it reduces the dependence of the EAS on the device BV. Note that while a six layer design has been chosen to illustrate the invention, any number of layers can be used.

DETAILED DESCRIPTION OF THE INVENTION

Figure 1:
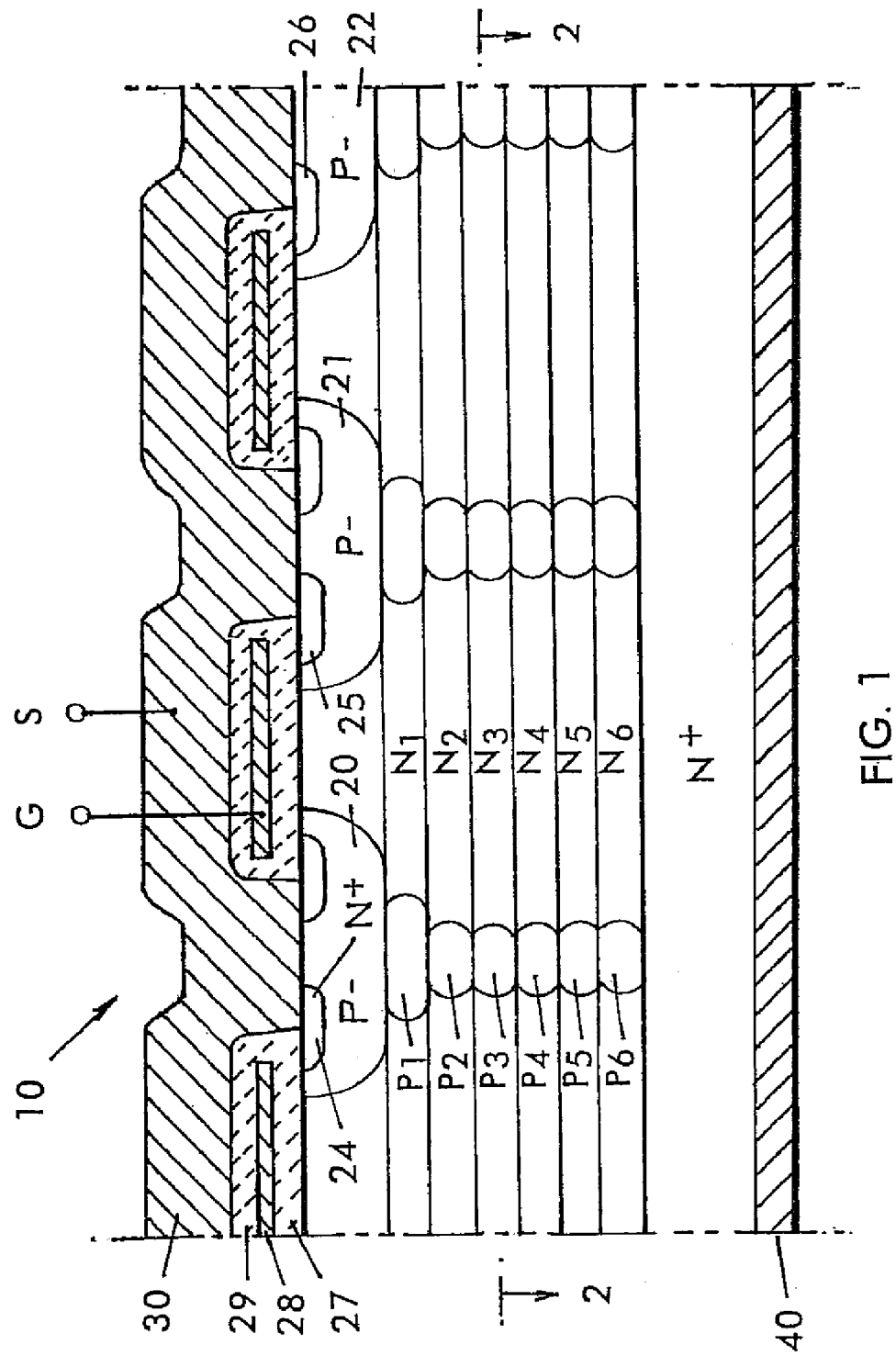
FIG. 1 is a cross-section of a small portion of the active area of a superjunction device, which employs the present invention.
Figure 2:
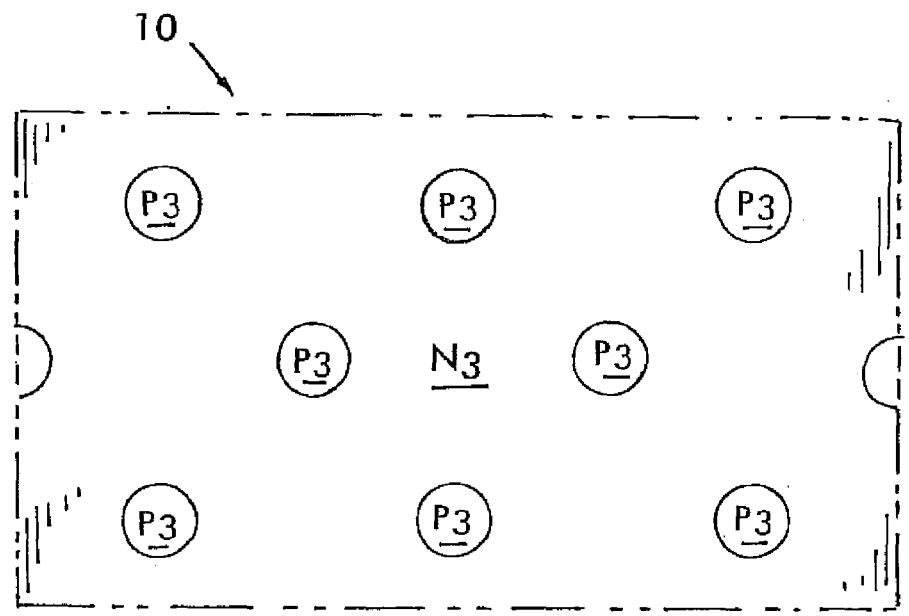
FIG. 2 is a cross-section of FIG. 1 taken across section line 2-2 in FIG. 1.
Figure 3:
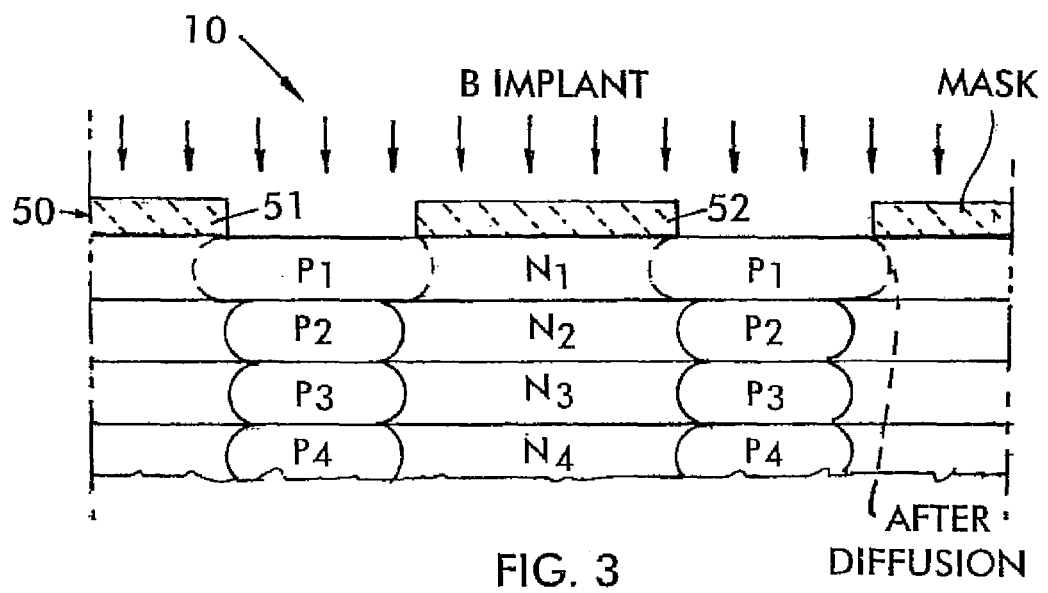
FIG. 3 shows the process step of forming an enlarged volume P section at the top of the P columns in accordance with the invention.

Referring to FIGS. 1 to 3, a silicon wafer (sometimes referred to as a die or chip) is formed of an $N^+$ wafer 10 which receives a series of epitaxial layers $N_6$ to $N_1$ which are sequentially formed. After the formation of each layer, an implant and diffusion is carried out to form P regions ($P_6$ to $P_1$ respectively). In the prior art, the implant and diffusions are identical in size and concentration and which are charge balanced to the surrounding charge of layers $N_6$ to $N_1$ respectively, which are each of the same concentrations.

Each of P regions $P_6$ to $P_1$ are aligned to one another to form a continuous column or "pylon".

A MOSgated structure is then formed atop each column, shown in FIG. 1 as P channel regions 20, 21 and 22 which conventionally receive $N^+$ source regions 24, 25 and 26 respectively. A gate oxide 27 is deposited over the inversion areas of each of channel regions 20, 21 and 26 respectively and a conductive polysilicon gate 28 is formed over each of gate oxide regions 27. An LTO insulation layer 29 is formed over gates 28 and a source electrode 30 is formed over the layer 29 and contacts each of sources 24, 25, 26 and the inner channel of regions 20, 21 and 22. Note that the channel regions 20, 21 and 22 may be polygonal cells or stripes; and columns $P_6$ to $P_1$ have corresponding circular or stripe shapes. A drain electrode 40 is attached to the bottom of $N^+$ region 10.

In accordance with the invention, the uppermost P regions $P_1$ have a greater diameter then that of the underlying regions $P_2$ to $P_6$, so that the top of the columns will have a greater P charge than that of the surrounding $N_1$ layer. The top-most column may have an increased diameter of only a few percent over that of the lower columns. By way of example, if the lower column elements $P_2$ to $P_6$ have a diameter, after diffusion of 5 microns, the top P region $P_1$ may have a diameter of 5.1 microns (2% greater) to obtain the benefits of the invention.

FIG. 3 shows the implant and diffusion of the top P region $P_1$. Thus, the layer $N_1$ is deposited atop layer $N_2$ and its P regions $P_2$. A mask 50 is then formed atop layer $N_1$ with windows 51, 52 aligned with the center of region $P_2$. A boron or other P species implant and diffusion is then carried out to form the enlarged diameter regions $P_1$ aligned to the tops of the P columns. However, the window diameter for windows 51 and 52 are larger than the implant windows in the mask for regions $P_2$ to $P_6$, creating the enlarged diameter top region $P_1$. Alternately, the diffusion process is carried out for a longer period of time to form enlarged regions $P_1$.

While the windows 51 and 52 are circular (FIG. 2), other shapes can be used for windows 51 and 52, such as elongated stripes, rectangles, ovals, or circles with projecting fingers, and the like to produce a larger P volume at the top of each column. In addition, regions $P_1$ need not be formed on every column over region $P_2$. Some column may include a $P_1$ region that is the same size as region $P_2$ or other regions in the P columns. These columns may be interspersed throughout the semiconductor device to obtain particular characteristics for the device.

Further, while the description above contemplates identical diameters (or widths) for P regions $P_2$ to $P_6$, they may be continuously tapered or stepped down in diameter from a larger diameter for regions $P_2$ to a smaller diameter for regions $P_6$. In addition, a number of upper P regions may be enlarged to some extent, and be in charge imbalance with the surrounding N type material. For example, the topmost two or three P regions may be enlarged in comparison to the lower P regions, and be in charge imbalance with the surrounding N type material.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A method for forming a superjunction device on a substrate having a first conductivity type, the method comprising:

forming a first layer of semiconductor material over the substrate, the first layer of semiconductor material being of the first conductivity type;

forming a first region of a second conductivity type in said first layer;

forming a second layer of semiconductor material over said first layer, the second layer of semiconductor material being of the first conductivity type;

forming a second region of said second conductivity type in said second layer, wherein said second region is larger in volume than said first region, wherein said first region and said second region are vertically aligned to form a pylon; and forming a MOSgated structure disposed on top of said second region, wherein said MOSgated structure comprises a channel region being of said second conductivity type and a plurality of source regions of an opposite conductive type than said second conductivity type, wherein said channel region is separate from said first region, said second region, said first layer and said second layer.

2. The method of claim 1, wherein the first conductivity type is N-type and the second conductivity type is P-type.

3. The method of claim 1, wherein the second region is approximately 2% larger than said first region.

4. The method of claim 3, wherein said first region is in charge balance with surrounding regions thereof, and said second region is in charge imbalance with surrounding regions thereof.

5. The method of claim 1, wherein the pylon has a substantially cylindrical shape.

6. The method of claim 1, wherein the superjunction device has improved avalanche capability.

7. The method of claim 1, wherein the channel region of said second conductivity is above and in contact with said pylon.

8. The method of claim 1, wherein said second region has a larger diameter than said first region.

9. The method of claim 1, wherein said larger volume for said second region selectively reduces the body voltage of the active area.

10. The method of claim 1, wherein current flows into the axis of said pylon.

11. The method of claim 10, wherein said current flow improves ruggedness.

12. The method of claim 1, wherein a boron diffusion is carried out to form said second region that has a larger volume than said first region.

13. The method of claim 1, wherein a diffusion process is carried out for a longer period to form said second region that has a larger volume than said first region.

14. The method of claim 1, wherein additional layers and regions are formed, and wherein said pylon is tapered down in diameter when stepping through from one region to the next.

* * * * *